(12) United States Patent
Mudd

(10) Patent No.: US 11,212,925 B2
(45) Date of Patent: Dec. 28, 2021

(54) LED PANEL FOR A MODULAR DISPLAY SCREEN

(71) Applicant: digiLED (UK) Limited, Dorking (GB)

(72) Inventor: Thomas Mudd, Dorking (GB)

(73) Assignee: digiLED (UK) Limited, Dorking (GB)

( * ) Notice: Subject to any disclaimer, the term of this patent is extended or adjusted under 35 U.S.C. 154(b) by 5 days.

(21) Appl. No.: 16/422,353

(22) Filed: May 24, 2019

(65) Prior Publication Data

US 2020/0375039 A1 Nov. 26, 2020

(51) Int. Cl.
| | |
|---|---|
| *H05K 5/00* | (2006.01) |
| *H05K 5/02* | (2006.01) |
| *H01R 33/90* | (2006.01) |
| *H01R 13/631* | (2006.01) |
| *G06F 3/14* | (2006.01) |
| *H01R 13/62* | (2006.01) |
| *H01R 13/14* | (2006.01) |
| *H01L 25/075* | (2006.01) |
| *H01R 13/08* | (2006.01) |

(52) U.S. Cl.
CPC ......... *H05K 5/0017* (2013.01); *G06F 3/1446* (2013.01); *H01R 13/6205* (2013.01); *H01R 13/631* (2013.01); *H01R 33/90* (2013.01); *H05K 5/0021* (2013.01); *H05K 5/0204* (2013.01); *H05K 5/0217* (2013.01); *H05K 5/0247* (2013.01); *H01L 25/0753* (2013.01); *H01R 13/08* (2013.01); *H01R 13/14* (2013.01)

(58) Field of Classification Search
CPC .. H05K 5/0017; H05K 5/0021; H05K 5/0204; H05K 5/0217; H05K 5/0247; H05K 7/1038; H05K 7/1069; G06F 3/1446; H01R 13/6205; H01R 13/631; H01R 33/90; H01R 13/08; H01R 13/14; H01R 13/635; H01R 11/30; H01R 12/716; H01R 13/193; H01R 13/2421; H01R 13/743; H01R 12/714; H01L 25/0753; G09F 9/3026; G09G 2300/023; G09G 2300/026
See application file for complete search history.

(56) References Cited

U.S. PATENT DOCUMENTS

| | | | |
|---|---|---|---|
| 8,366,468 B2 * | 2/2013 | Carnevali | G06F 1/1632 439/248 |
| 2012/0077364 A1 * | 3/2012 | Boyer | H01R 13/621 439/345 |
| 2017/0039021 A1 * | 2/2017 | Hall | G09F 9/3026 |
| 2017/0105293 A1 * | 4/2017 | Kim | G09F 9/00 |

* cited by examiner

*Primary Examiner* — James Wu
*Assistant Examiner* — Hung Q Dang
(74) *Attorney, Agent, or Firm* — Nikolas J. Uhlir; Grossman, Tucker, Perreault & Pfleger PLLC

(57) ABSTRACT

An LED (light emitting diode) panel. In particular, an LED panel that is part of a modular system used to construct a wall mounted LED video screen. An LED panel includes a chassis and an LED tile including a plurality of surface mount devices attached thereto. The LED tile is removably mounted to a front of the chassis, and further includes: a first power connector and a first data connector; and a connector assembly mounted on the chassis. The connector assembly includes a support board; a second power connector; a second data connector; and a biasing member arranged to urge the support board in a direction towards the front of the chassis, such that the second power connector and second data connector engage with the first power connector and first data connector, respectively.

15 Claims, 11 Drawing Sheets

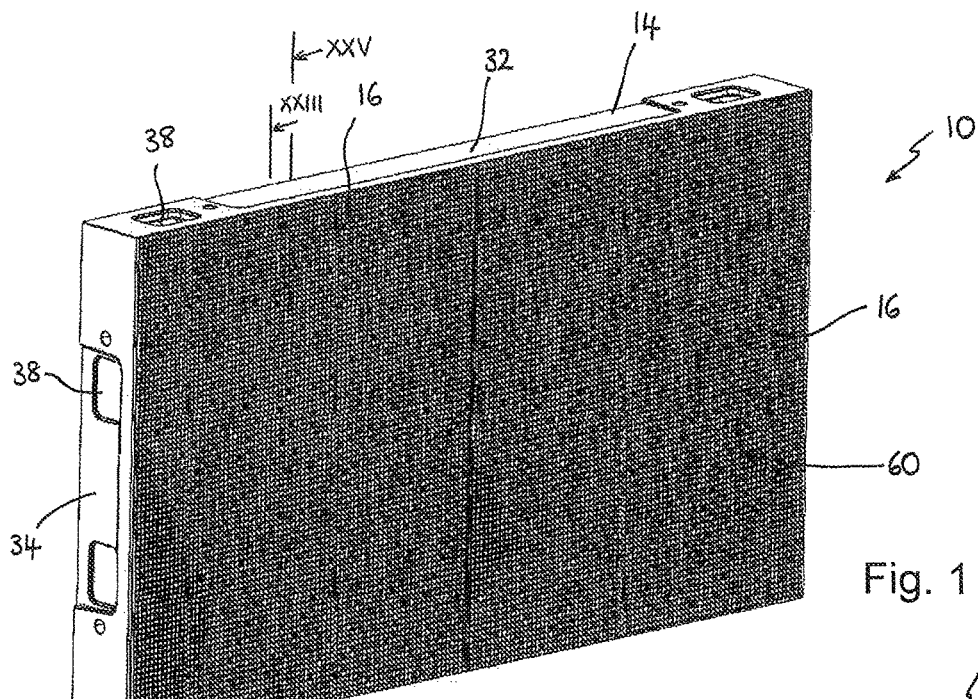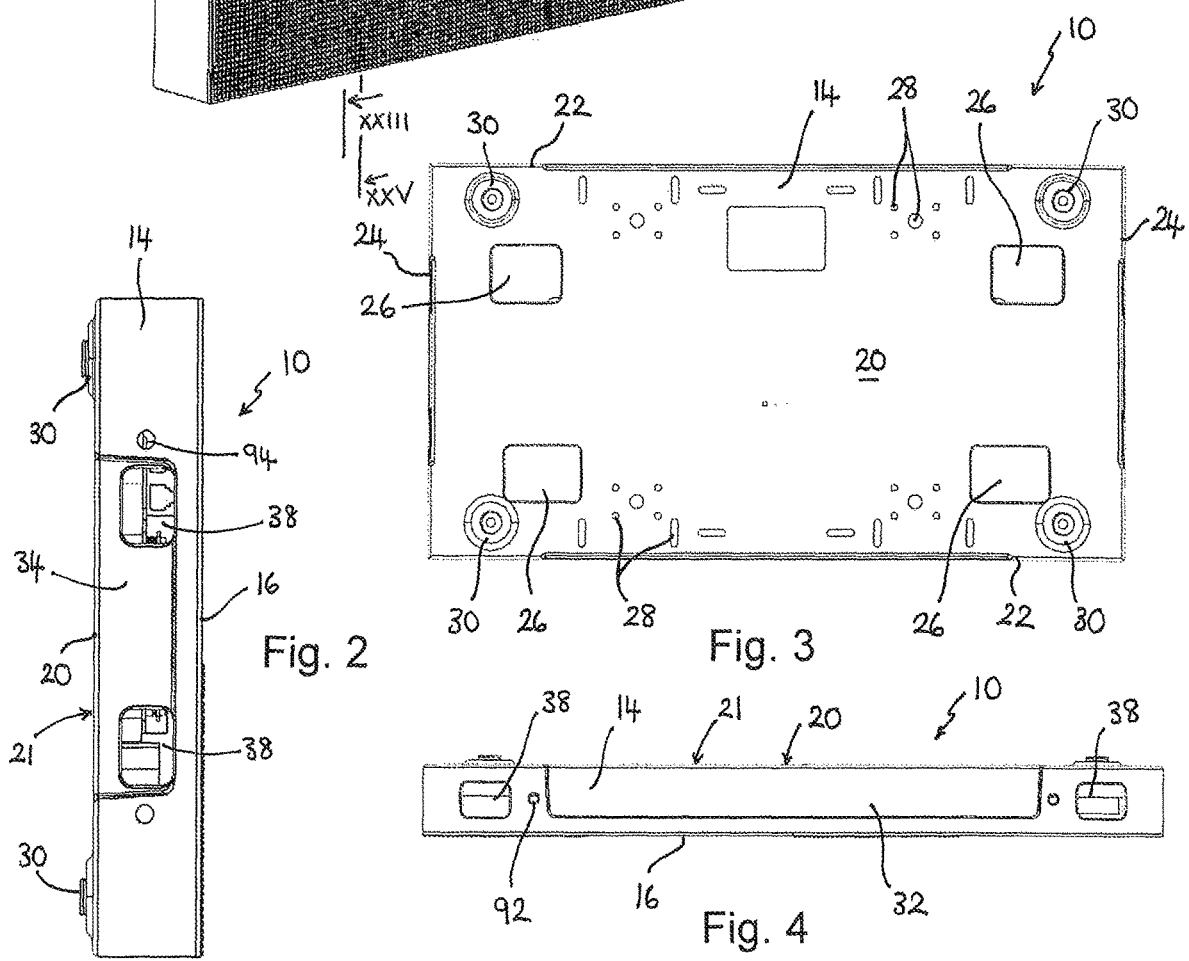

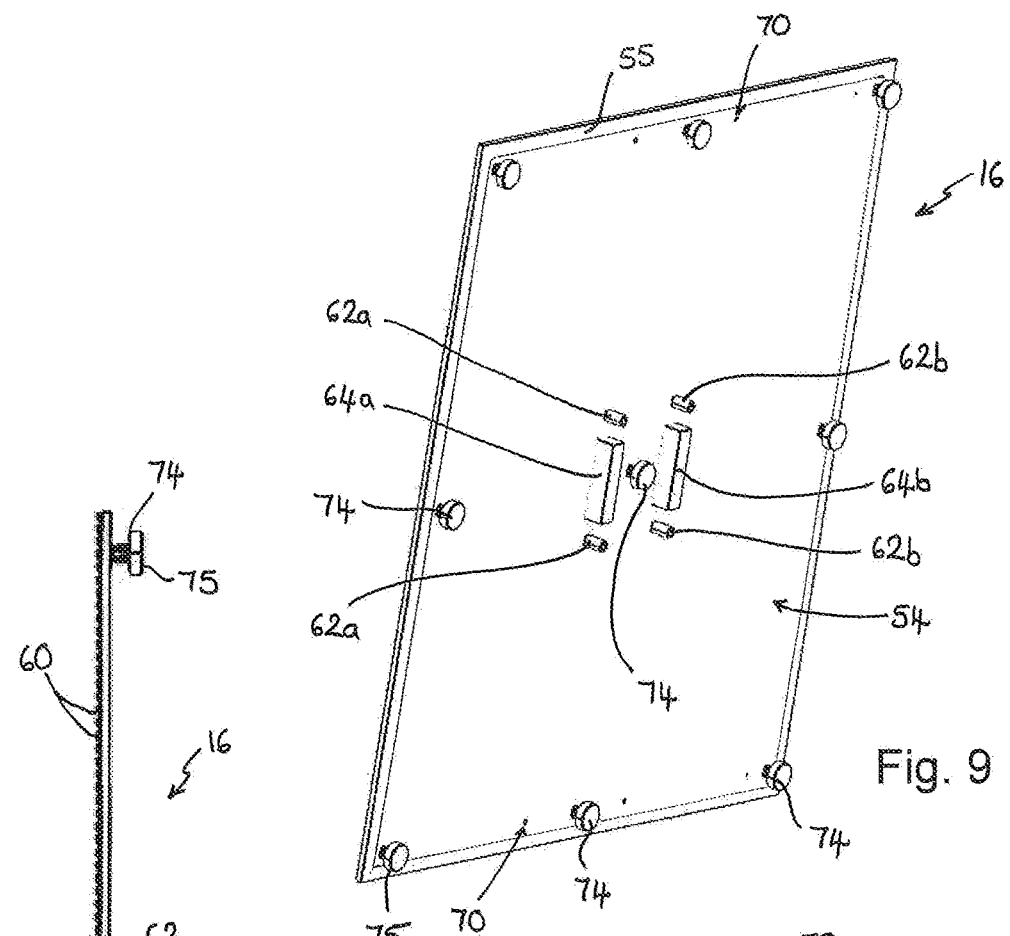
Fig. 9
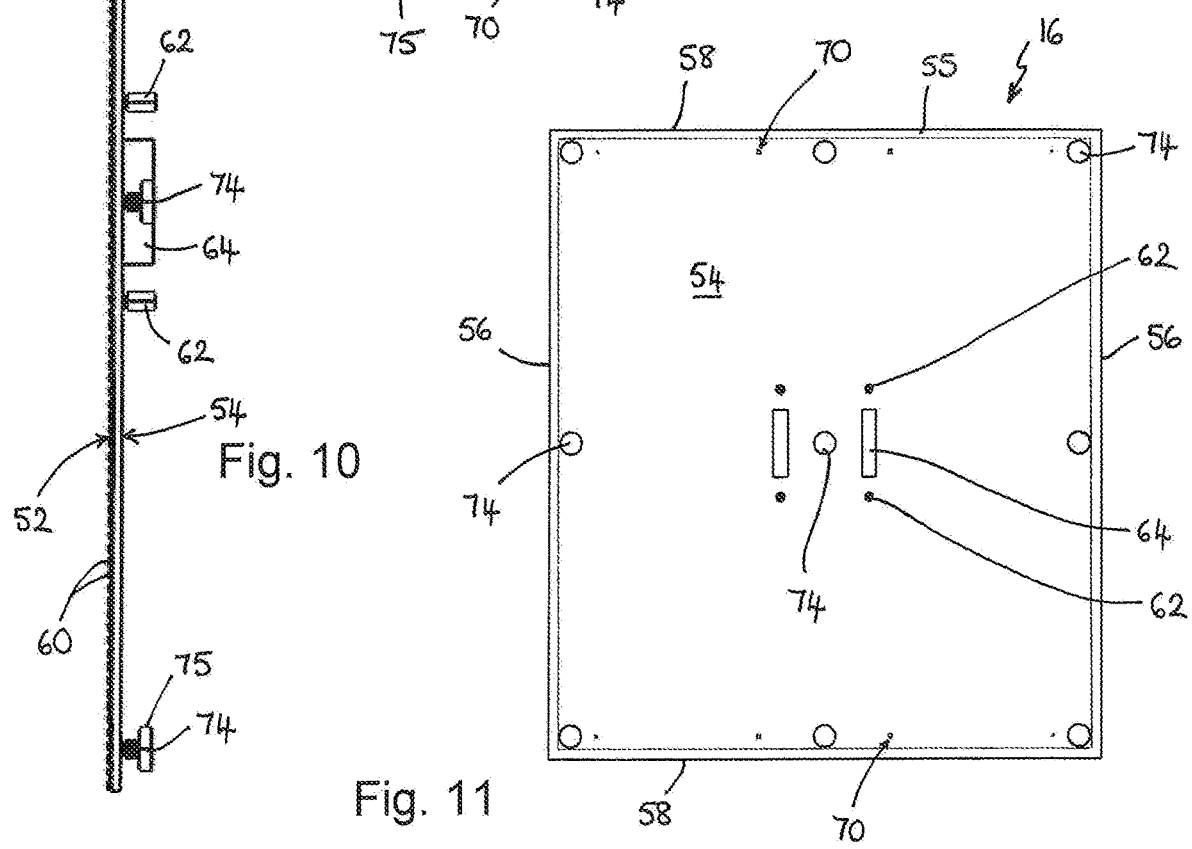
Fig. 10
Fig. 11

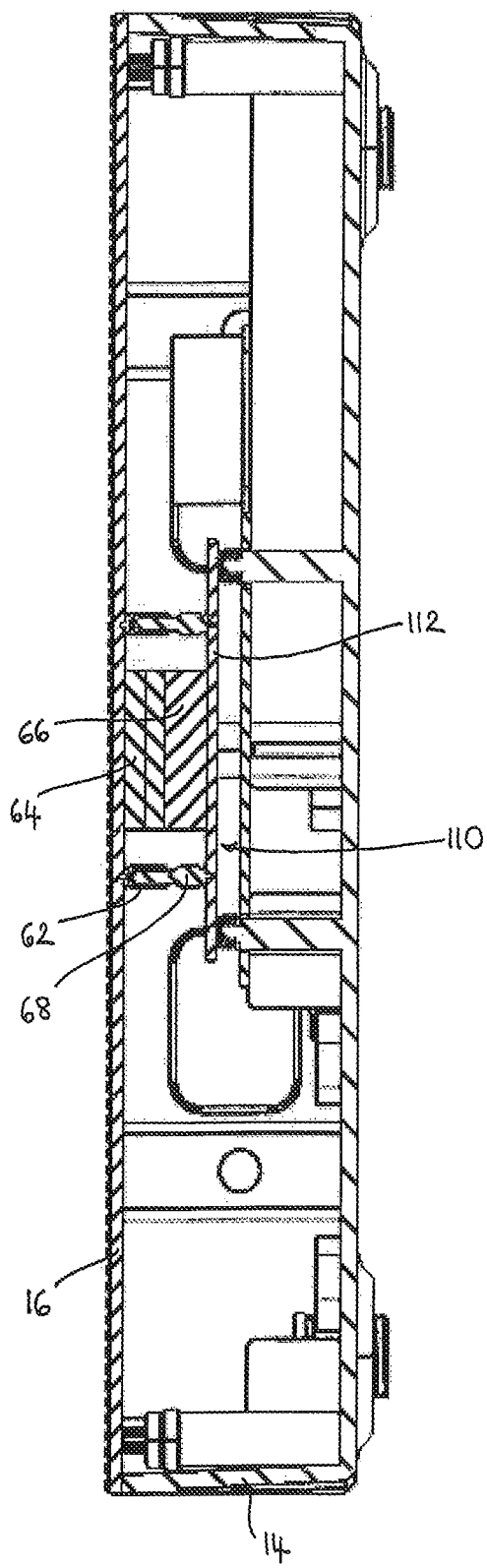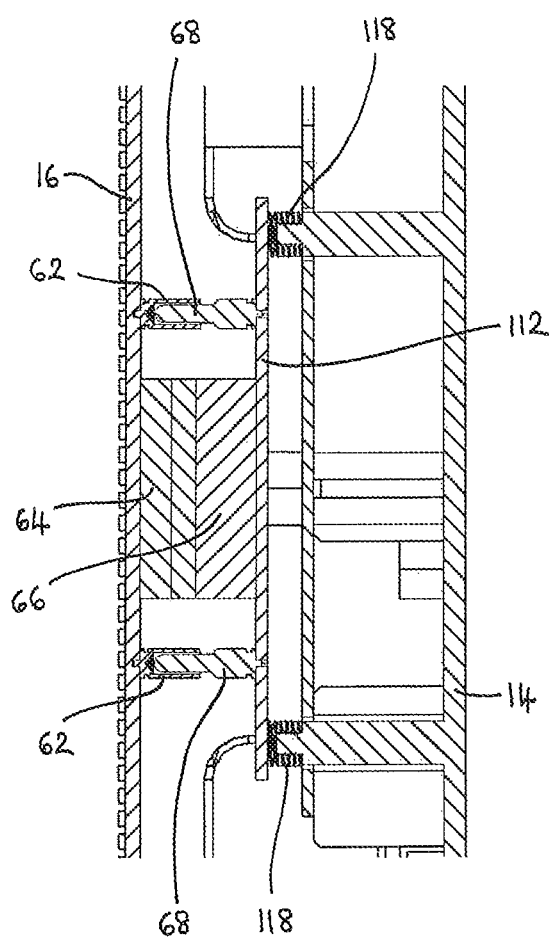
Fig. 23
Fig. 24

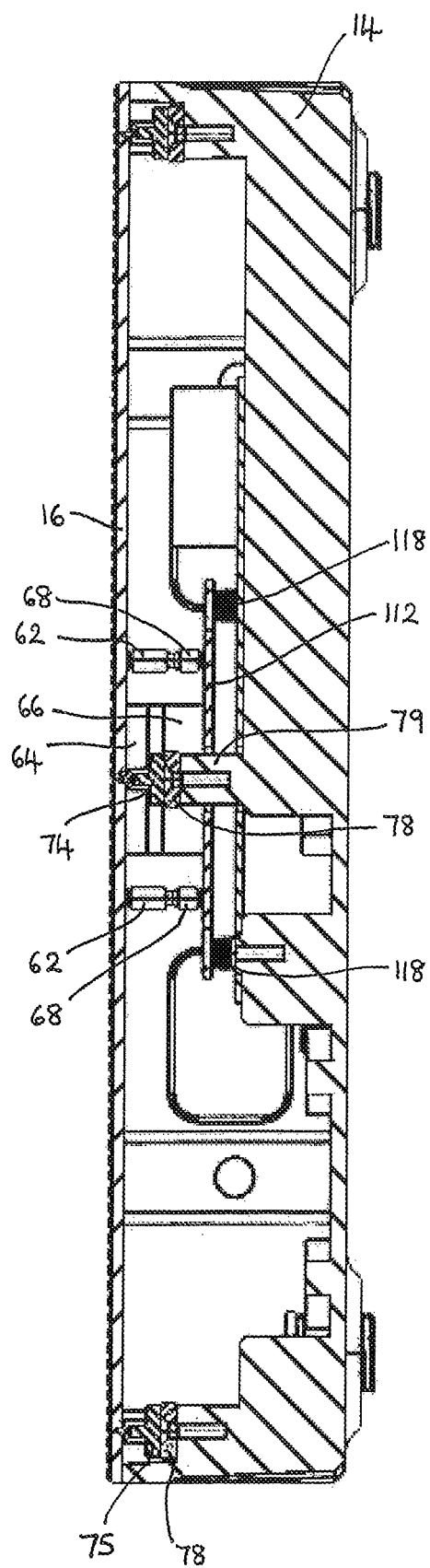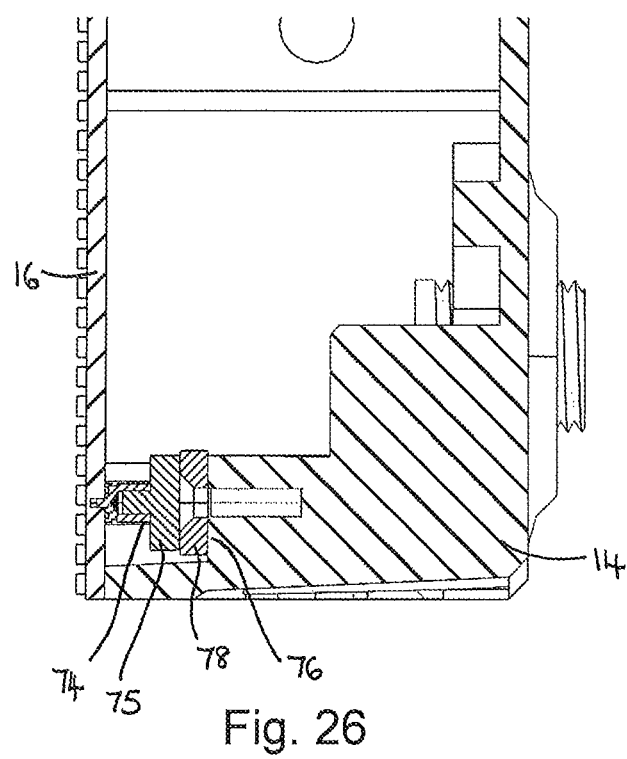
Fig. 26
Fig. 25

LED PANEL FOR A MODULAR DISPLAY SCREEN

FIELD

The present disclosure relates to an LED (light emitting diode) panel. In particular, the present disclosure relates to an LED panel that is part of a modular system used to construct a wall mounted LED video screen, and to such an LED screen.

BACKGROUND

LED video screens or LED video walls include a plurality of modular LED panels arranged such that the video screen displays content as if it were a single screen. Each LED panel has power and data connections such that each panel may operate separately from other panels in the screen. One or more control systems control the operation of each of the LED panels so that the LED video screen displays the required content as if it were a single screen.

Each LED panel includes a housing containing the power and data connections and an LED tile attached to a front of the housing. The LED tile includes a plurality of surface mount devices in the form of an LED package comprising red, green and blue LEDs. Each surface mount device, therefore, creates a pixel of the LED video screen allowing images to be displayed. In some examples the display may be monochrome.

In order to display a seamless image across the LED screen, the LED panels may be mounted relative to neighbouring panels such that that the overall screen is flat. To achieve this, the LED panels are traditionally mounted on a frame to ensure accurate construction of the complete LED screen.

The use of LED video screens and LED video walls is becoming increasingly popular. It is therefore an object of the present disclosure to provide an improved LED panel and LED screen that permits its use in different locations, for example as a direct replacement for LCD monitors or projectors, and allows for easy installation of an LED video screen.

SUMMARY

An aspect of the invention provides an LED panel for a modular display screen comprising:
a chassis;
an LED tile comprising a plurality of surface mount devices attached to a first surface of the LED tile, wherein the LED tile further comprises a first power connector and a first data connector and the LED tile is removeably mounted to a front of the chassis;
a connector assembly mounted on the chassis, the connector assembly comprising:
  a support board;
  a second power connector and a second data connector projecting from a first surface of the support board; and
  a biasing member arranged to urge the support board in a direction towards the front of the chassis, such that the second power connector and second data connector engage with the first power connector and first data connector, respectively.

In some embodiments the second power connector and the second data connector project from the first surface of the support board in a direction towards the front of the chassis.

In some embodiments the first power connector and the first data connector project from a second surface of the LED tile opposite the first surface.

In some embodiments the biasing member is disposed between the support board and a part of the chassis.

In some embodiments the connector assembly comprises a plurality of biasing members. In some embodiments each of the biasing members is disposed proximate a corner of the support board.

In some embodiments the biasing member is a spring.

In some embodiments the connector assembly further comprises a retaining member arranged to limit movement of the support board in a direction towards the front of the chassis.

In some embodiments the first and second data connectors are low insertion force data connectors.

In some embodiments the LED tile further comprises a third power connector and a third data connector, the connector assembly comprises a fourth power connector and a fourth data connector, and, in use, the fourth power connector and fourth data connector engage with the third power connector and third data connector, respectively.

In some embodiments the LED panel comprises two LED tiles and two connector assemblies mounted on the chassis, each of the LED tiles including a first power connector and a first data connector and each of the connector assemblies including a second power connector and a second data connector, and wherein, in use, a first one of the LED tiles engages with a first one of the connector assemblies and a second one of the LED tiles engages with a second one of the connector assemblies.

In some embodiments each of the LED tiles further comprises a third power connector and a third data connector, each of the connector assemblies further comprises a fourth power connector and a fourth data connector, and, in use, the fourth power connector and fourth data connector of each of the connector assemblies engage with the respective third power connector and third data connector of a respective one of the LED tiles.

In some embodiments the LED tile includes alignment features arranged to engage with corresponding alignment features of the chassis to align the LED tile with the chassis. In some embodiments the alignment features of the LED tile comprise alignment recesses and the alignment features of the chassis comprise alignment pins receivable in the alignment recesses.

In some embodiments the LED tile includes a plurality of securing members configured to engage with securing elements of the chassis. In some embodiments each of the securing members comprises a magnetic foot and each of the securing elements comprises a metal seat.

Another aspect of the invention provides a method of installing an LED display, comprising:
mounting a plurality of LED panels to a surface, wherein each LED panel comprises:
  a chassis;
  an LED tile comprising a plurality of surface mount devices attached to a first surface of the LED tile, wherein the LED tile further comprises a first power connector and a first data connector and the LED tile is removeably mounted to a front of the chassis; and
  a connector assembly mounted on the chassis, the connector assembly comprising:
    a support board;
    a second power connector and a second data connector projecting from a first surface of the support board; and a biasing member arranged to urge the support board in a direction towards the front of the chassis, such that the second power connector and second data connector engage with the first power connector and first data connector, respectively.

In some embodiments the method further comprises:
mounting a plurality of chassis to a surface; and
subsequently mounting an LED tile to each of the chassis such that the second power connector and second data connector engage with the first power connector and first data connector, respectively.

BRIEF DESCRIPTION OF THE DRAWINGS

Aspects of the present disclosure will now be described with reference to the accompanying drawings, in which like numerals depict like parts, and in which:

FIG. 1 is a perspective view of one embodiment of an LED panel in accordance with the present disclosure, wherein the LED panel includes a chassis and two LED tiles;

FIG. 2 is an end view of the LED panel of FIG. 1;

FIG. 3 is a rear view of the LED panel of FIG. 1;

FIG. 4 is a top view of the LED panel of FIG. 1;

FIG. 9 is a rear perspective view of one of the LED tiles of FIG. 1;

FIG. 10 is a side view of the LED tile of FIG. 9;

FIG. 11 is a rear view of the LED tile of FIG. 9;

FIG. 23 is a cross-sectional view of the LED panel of FIG. 1 along the line XXIII-XXIII showing connections between one of the LED tiles and the chassis and one of the LED tiles and internal power and data components of the LED panel;

FIG. 24 is an enlarged view of a part of FIG. 23 showing power and data connections to the LED tile;

FIG. 25 is a cross-sectional view of the LED panel of FIG. 1 along the line XXV-XXV showing connections between one of the LED tiles and the chassis;

FIG. 26 is an enlarged view of a part of FIG. 25; and

DETAILED DESCRIPTION

Figure 7:
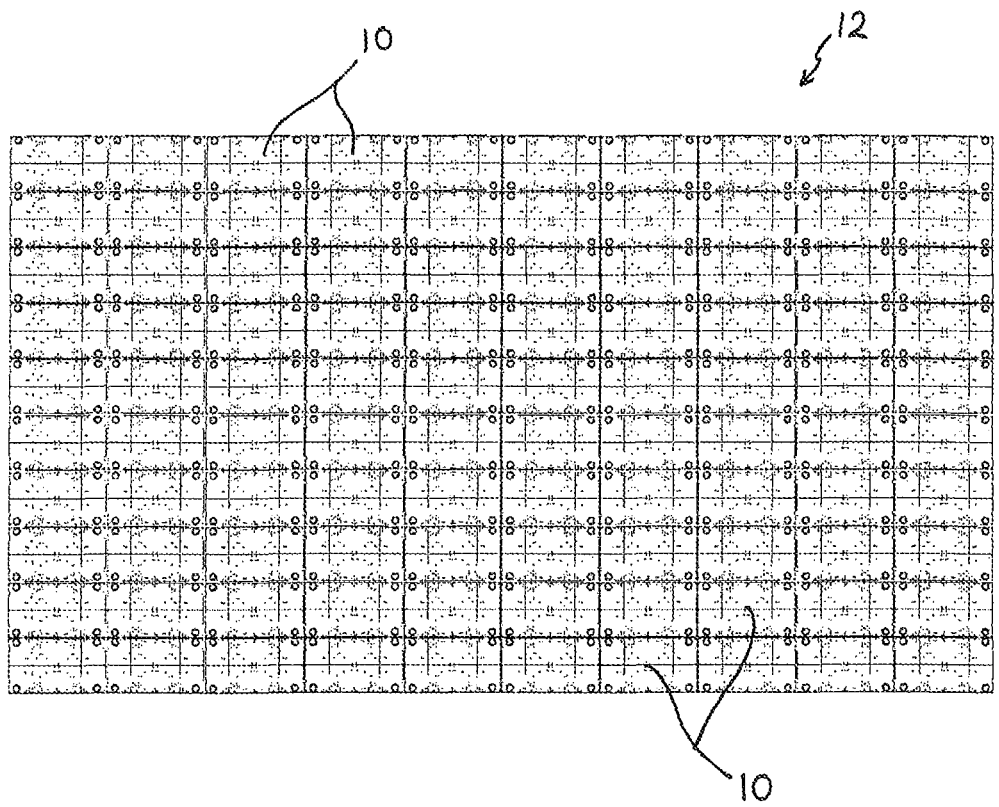
FIG. 7 illustrates one example of an array of LED panels forming an LED display screen, in accordance with the present disclosure.

FIGS. 1 to 4 show an LED (light emitting diode) panel 10 according to a preferred embodiment of the present disclosure. The LED panel 10 is part of a modular system that forms a display screen 12 (FIG. 7). In use a plurality of LED panels 10 are arranged side by side and one above the other in an array to create the complete display screen 12. The LED panels 10 of the present disclosure may be used to form a wall mounted LED video screen.

Each LED panel 10 comprises a chassis or housing 14 and two LED tiles (or modules) 16. The chassis 14 is used to mount the LED panel 10 on a suitable wall or other supporting structure. Furthermore, the chassis 14 provides an interior space 18 for housing a power supply or power connection, control electronics and data connections for operation of the LED tiles 16 and subsequent transmission of data to other LED panels 10.

The chassis 14 comprises a rectangular rear wall 20 having two longer edges 22 and two shorter edges 24. The ratio of the lengths of the shorter edges 24 and longer edges 22 may vary, and in embodiments is 16:9. For example, in embodiments the length of a shorter edge 24 is about 281.25 mm and the length of a longer edge 22 is about 500 mm. In other embodiments the ratio of the lengths of the shorter edges 24 and longer edges 22 may be different. For example, in embodiments the dimensions of the shorter edges 24 and longer edges 22 are in multiples of 250 mm.

The rear wall 20 includes at least one cable routing hole 26. In embodiments, and as shown most clearly in FIG. 3, the rear wall 20 includes four cable routing holes 26, each of which is proximate a corner of the rear wall 20. As illustrated, each of the cable routing holes 26 is substantially rectangular; however, it will be appreciated that the cable routing holes 26 may be of any suitable shape.

Prior to first use of the LED panel 10 each of the cable routing holes 26 in the rear wall 20 is covered by a conductive material, such as but not limited to a sheet of copper foil. This improves the ability of the chassis 14 to act as a Faraday cage. To allow a cable to be routed through one of the cable routing holes 26, the conductive material may be cut or punched through to allow the cable to extend through the cable routing hole 26.

A plurality of adjuster assemblies 30 are connected to the rear wall 20 of the chassis 14. The number of adjuster assemblies 30 is not limited and may be selected to suit a variety of applications. In embodiments, the LED panel 10 includes at least one adjuster assembly 30. For example, in some embodiments the LED panel 10 includes four adjuster assemblies 30, wherein each adjuster assembly 30 is proximate a corner of the rear wall 20. In any case, the adjuster assemblies 30 may be used to space the rear wall 20 of the chassis 14 from a surface on which the LED panel 10 is mounted, as described further below.

The rear wall 20 may include a plurality of mounting apertures 28 for securing the chassis 14 to a surface.

The chassis 14 further includes two opposing long side walls 32 extending along and projecting from the longer edges 22 of the rear wall 20 and two opposing short side walls 34 extending along and projecting from the shorter edges 24 of the rear wall 20. The height of each of the side walls 32, 34 is not limited and may be selected to suit a particular application. In embodiments, the height of each of the side walls 32, 34 is about 50 mm. In any case, the top edges of the side walls 32, 34 furthest from the rear wall 20 define a front 36 of the chassis 14.

Each of the long and short side walls 32, 34 includes at least one cable routing hole 38. In embodiments and as shown most clearly in FIGS. 2 and 4, each side wall 32, 34 includes two cable routing holes 38 spaced apart along a length of the side wall 32, 34. In the illustrated embodiment each of the cable routing holes 38 is substantially rectangular; however, it will be appreciated that the cable routing holes 38 may be of any suitable shape.

The chassis 14 of the LED panel 10 is made of a suitable metal material, such as aluminium. In embodiments the chassis 14 is die-cast aluminium which is machined to create a planar rear surface 21 of the rear wall 20.

It will be appreciated that a plurality of LED panels 10 are arranged in an array, side by side and one above the other, to form a complete LED display 12 as illustrated in FIG. 7. To supply power and data to each of the LED panels 10 in the array, suitable power and data connections are formed between neighbouring LED panels 10.

Figure 8:
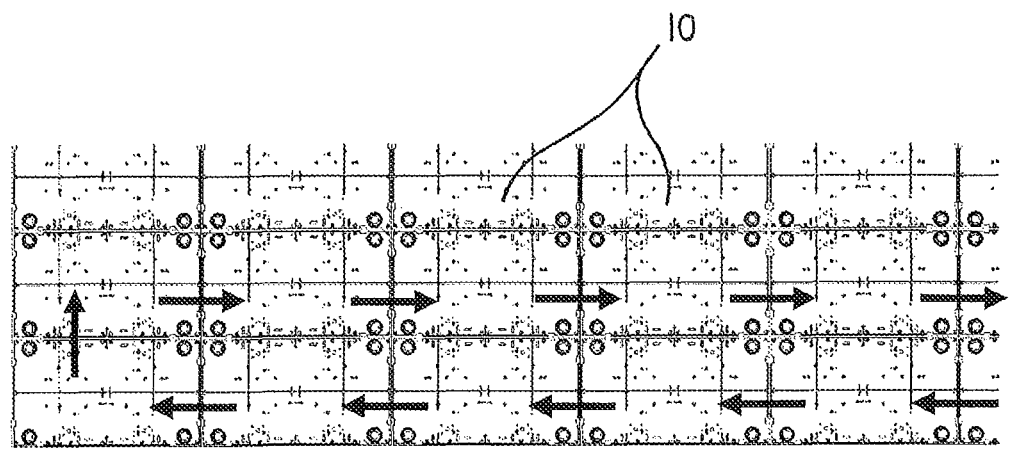
FIG. 8 shows a part of the LED display screen of FIG. 7, and illustrates a direction of flow of power between neighbouring LED panels.

Each LED panel 10 includes a power cable 40 having a male connector or input plug 42 and a female connector or output socket 44. In embodiments the male and female connectors 42, 44 are IEC (International Electrotechnical Commission) connectors. In some LED displays 12 power is connected to the display at a right hand side, and in particular may be connected to a lowermost LED panel 10 in the right hand column of the display 12. In embodiments and as illustrated in FIG. 8, when power connections between LED panels 10 of a first row of the display 12 are connected right to left, power connections between LED panels 10 of a second row of the display 12 are connected left to right. This allows power to be provided to each panel without having to route a power cable all the way from one side of the display 12 to the other, and allows power to flow right to left through rows of the display 12. This also results in less cabling and enables a more compact installation of the display 12.

It will be appreciated that in some embodiments of a display 12, the display 12 may have multiple power input cables. For example, each power input cable may supply power to two rows of the screen. It will further be appreciated that in some embodiments it may be desirable for power connections to be made between neighbouring panels 10 in columns of the display 12. For example, power connections between LED panels 10 of a first column of the display 12 may be connected bottom to top and power connections between LED panels 10 of a second column of the display 12 may be connected top to bottom.

Figure 6:
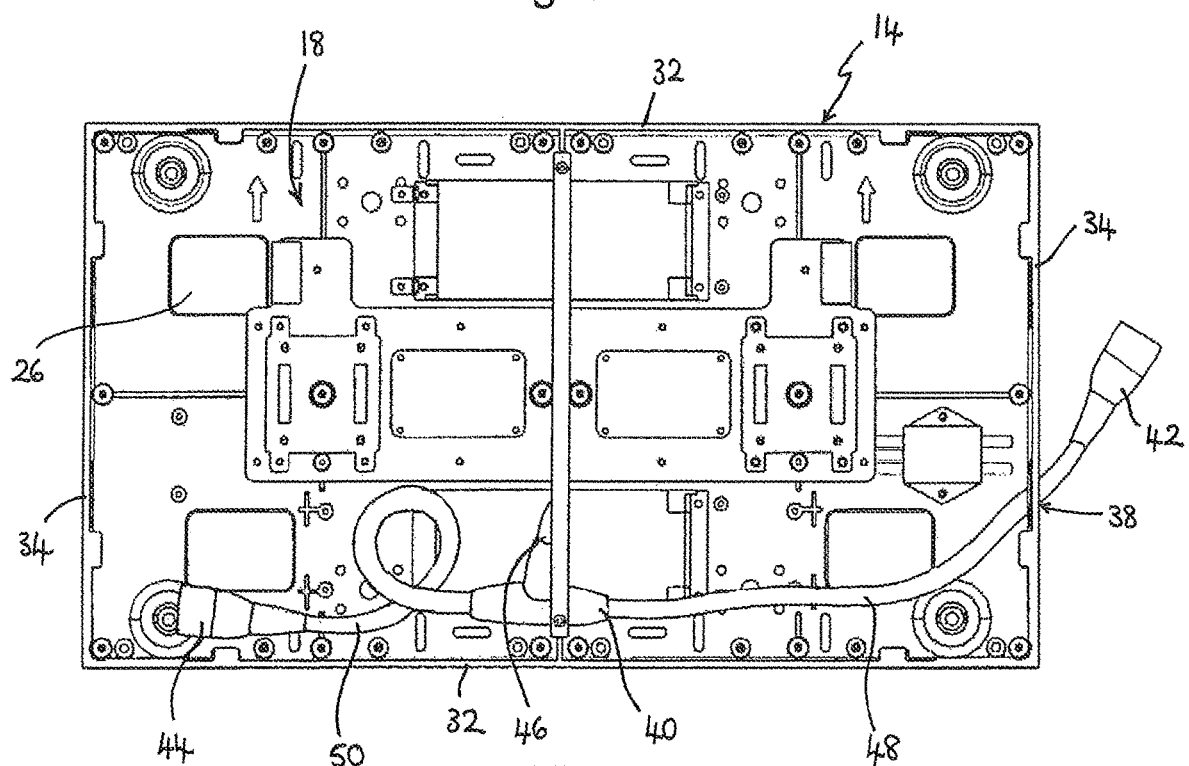
FIG. 6 is a front view of the chassis and internal components of FIG. 5, additionally showing a power connector.

In some embodiments power is connected right to left through some LED panels 10, and left to right through other panels 10. In such embodiments the LED panel 10 of the present disclosure includes a branched power cable 40, as shown most clearly in FIG. 6. A central stem 46 of the cable 40 is connected to the control electronics of the LED panel 10. A first branch 48 of the cable 40 extends from the central stem 46 and terminates in an input plug 42. A second branch 50 of the cable 40 extends from the central stem 46 and terminates in an output socket 44. In embodiments the first and second branches 48, 50 extend from an end of the central stem 46 in substantially opposite directions, such that the branched cable 40 is substantially T-shaped.

In embodiments the central stem 46 of the cable 40 is generally centrally located in a lateral direction within the interior space 18 of the chassis 14. The cable 40 is movable between a first configuration and a second configuration. In the first configuration the first branch 48 extends towards a right hand side wall 34 of the chassis 14 and the second branch 50 extends towards a left hand side wall 34 of the chassis 14. In the second configuration, the first branch 48 extends towards the left hand side wall 34 of the chassis 14 and the second branch 50 extends towards the right hand side wall 34 of the chassis 14. The cable 40 is movable between the first and second configurations by twisting the central stem 46 of the cable 40 and re-routing each of the first and second branches 48, 50 within the interior space 18 of the chassis 14. Notably, a branch 48, 50 of the power cable 40 may be routed through a cable routing hole 38 in one of the long side walls 32 of the chassis 14 to route power to an adjacent row of the display 12.

During installation, end regions of one or both of the first and second branches 48, 50 extend through respective cable routing holes 26, 38 to enable connections to be made between neighbouring LED panels 10. If it is desired to route a part of one of the branches 48, 50 of the cable 40 through one of the cable routing holes 26 in the rear wall 20 of the chassis 14, the conductive material (e.g. copper foil) is punched through to allow the cable 40 to extend through the cable routing hole 26.

An advantage of the configuration of the cable 40 having a central stem 46 and two branches 48, 50 is that the cable can be arranged such that the male connector 42 is non-energised and high voltages (if present) are presented on the female connector 44.

Referring now to FIGS. 9 to 11, each LED tile 16 has a geometric shape, and has a front surface 52 and a rear surface 54. In embodiments, each LED tile 16 is rectangular having a first pair of opposite edges 56 and a second pair of opposite edges 58. In embodiments, to allow two LED tiles 16 to be attached side by side to the front 36 of the chassis 14 each LED tile 16 has a length of the first pair of opposite edges 56 is equal to a first dimension of the chassis and a length of the second pair of opposite edges 58 is half the length of a second dimension of the chassis. In some embodiments the chassis 14 has dimensions of 281.25 mm by 500 mm and each of the LED tiles 16 has dimensions of 281.25 mm by 250 mm.

A plurality of LED surface mount devices 60 are mounted on the front surface 52 of each LED tile 16 in an array. Each surface mount device 60 is in the form of an LED package comprising red, green and blue LEDs. Each surface mount device 60 forms a pixel of the LED tile 16 allowing images, video or data to be displayed. In some embodiments the surface mount devices 60 may be configured to provide a monochrome display.

The rear surface 54 of each LED tile 16 includes a printed circuit board. A plurality of integrated circuits and other electronic components (not shown) may be attached to the rear surface 54 of each LED tile 16. At least one power connector 62 and at least one data connector 64 are mounted on and extend from the rear surface 54. In embodiment of FIGS. 9-11, each LED tile 16 includes a first data connector 64a and a second data connector 64b, and a first pair of power connectors 62a and a second pair of power connectors 62b. The first data connector 64a is disposed between the power connectors 62a of the first pair to form a first set of connectors and the second data connector 64b is disposed between the power connectors 62b of the second pair to form a second set of connectors. The data connectors 64 and power connectors 62 of the LED tile 16 are configured to engage with and form a connection with corresponding data connectors 66 and power connectors 68 in the chassis 14 of the LED panel 10 when an LED tile 16 is attached to the front 36 of the chassis 14. For example, in embodiments a first power connector 62 and a first data connector 64 are mounted on and extend from a surface of the LED tile 16, e.g., rear surface 54. In such embodiments the LED panel 10 includes a corresponding second data power connector 68 and data connector 66, which engage and form a connection with the first power connector 63 and first data connector 64, respectively, when LED tile 16 is attached to chassis 14.

The rear surface 54 of each LED tile 16 further comprises a plurality of alignment features 70. The alignment features 70 engage with corresponding alignment features 72 of the chassis 14 to accurately align an LED tile 16 with the chassis 14 when the LED tile 16 is attached to the front 36 of the chassis 14. In the embodiment of FIGS. 9-11 the alignment features 70 comprise alignment recesses 70 for receiving alignment pins or alignment protrusions 72 of the chassis 14. As shown most clearly in FIG. 11, the alignment features 70 include includes four alignment recesses, two proximate a first edge 58 of an LED tile 16 and two proximate a second, opposite edge 58 of the LED tile 16.

The rear surface 54 of each LED tile 16 also includes a plurality of securing members 74 configured to engage with securing elements 76 of the chassis 14. The securing members 74 and securing elements 76 are configured such that the LED tile 16 may be repeatedly attached to and removed from the chassis 14. The securing members 74 and securing elements 76 are also configured such that the LED tile 16 is attached to the chassis 14 so that there is no movement between the LED tile 16 and chassis 14 during use. In the embodiment of FIGS. 9-11 the securing members 74 include magnetic feet or pegs 75 that engage with metal (e.g., ferrous) seats 78 of the chassis 14. In other embodiments the magnetic feet 75 may be disposed in the chassis 14 and the metal seats 78 may be provided on the LED tile 16.

The number of magnetic feet 75 is not limited, and may be selected to suit a particular application. In the embodiment of FIGS. 9-11 and shown most clearly in FIGS. 9 and 11, each LED tile 16 includes nine magnetic feet 75. A magnetic foot 75 is disposed proximate each of the four corners of the LED tile 16, a (central) magnetic foot 75 is disposed midway along a length of each edge 56, 58 of the LED tile 16, and a magnetic foot 75 is disposed centrally in the rear surface 54 of the tile 16. In this embodiment the central magnetic foot 75 is disposed between the first and second sets of connectors 62, 64. It will be appreciated that in other embodiments the magnetic feet 75 may be located in any suitable positions on the LED tile 16.

In some embodiments each of the securing members 74 is configured such that some movement of the magnetic foot 75 may be accommodated to allow the LED tile 16 to remain flat when secured to the chassis 14.

Any suitable type of securing members 74 may be used. In embodiments the securing members 74 and securing elements 76 are configured and designed such that the LED tile 16 is mounted to the front 36 of the chassis 14 by application of a force in a first direction substantially perpendicular to a plane of the LED tile 16 and may be removed from the chassis 14 by application of a force in second direction that is substantially opposite the first direction. In those or other embodiments the securing members 74 and securing elements 76 may form part of a contact fastener, i.e. a fastener that removably mounts the LED tile 16 to the chassis 14 by simple contact of one part with another part.

To improve the ability of the chassis 14 and LED tile 16 to act as a Faraday Cage the rear surface 54 of the LED tile 16 preferably includes a border region 55 that includes a coating having a high electrical conductivity. The border region 55 of the LED tile 16 contacts, and in particular makes electrical contact with, the front 36 of the chassis 14, i.e. top edges of the side walls 32, 34, when the LED tile 16 is attached to the chassis 14. In embodiments the border region 55 of the LED tile 16 includes a coating of gold, or is gold-plated.

The LED tile 16 may further include spring-loaded gold pins spaced around the perimeter of the LED tile 16 and extending from the rear surface 54 of the LED tile 16. Again, these pins contact, and in particular make electrical contact with, the front 36 of the chassis 14, i.e. top edges of the side walls 32, 34, when the LED tile 16 is attached to the chassis 14. The pins assist in grounding the electronic components of the LED tile 16.

With particular reference to FIGS. 5, 13, 25 and 26, the chassis 14 includes a plurality of alignment features 72 in the form of alignment pins 72. These pins 72 are configured to align and engage with the alignment recesses 70 of the LED tile 16 when the LED tile 16 is secured to the front 36 of the chassis 14. Accordingly, the alignment pins 72 protrude from the front 36 of the chassis 14. In embodiments each alignment pin 72 extends from a top of an alignment post 73 in the interior space 18 of the chassis 14.

In some embodiments each of the alignment pins 72 is secured to the respective alignment post 73 by an adhesive. During manufacture of the chassis 14, an alignment pin 72 may be attached to a respective post 73 by a suitable adhesive. Before the adhesive has fully cured, a master tile (having dimensions and alignment features corresponding to those of an LED tile) is positioned on and secured to the chassis 14 so that the alignment pins 72 are engaged with the alignment features/recesses of the master tile (not shown). In this way, the alignment pins 72 are positioned so that, subsequently, each LED tile 16 on the chassis 14 may be located in the desired position. In other embodiments each alignment pin 72 may be attached to the respective post 73 by a suitable mechanical connection, such as but not limited to a screw thread.

The chassis 14 further includes a plurality of securing elements 76. Each of the securing elements 76 include a metal seat or cap 78 disposed at a top of a post 79 in the interior space 18 of the chassis 14. A distance between a surface of each of the metal seats 78 and the front 36 of the chassis 14 is such that when the magnetic feet 75 are engaged with the metal seats 78, the rear surface 54 of the LED tile 16 is in contact with the top edges of the side walls 32, 34 of the chassis 14, as shown most clearly in FIG. 26.

Figure 12:
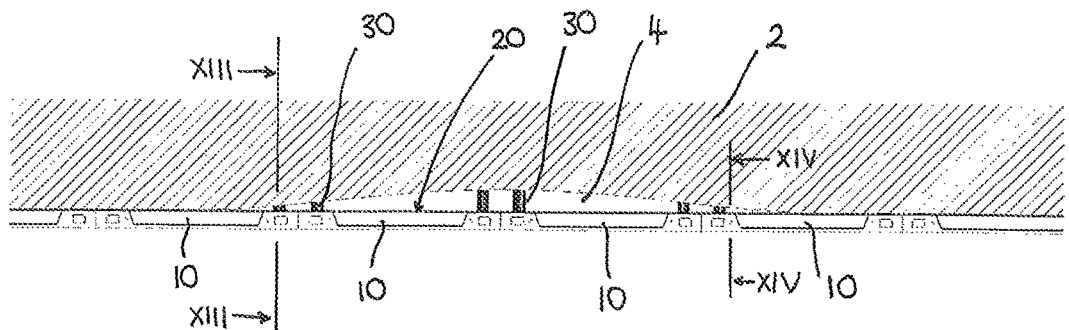
FIG. 12 illustrates an embodiment in which LED panels in accordance with the present disclosure are mounted on a wall, and include adjustable feet to accommodate undulations in a surface of the wall.

The LED panels 10 of the present disclosure are designed to be mountable directly on a surface of a wall 2 or other object. In some instances, a wall 2 to which the LED panels 10 are being mounted will not be perfectly flat. In particular the surface of the wall 2 may include dips or recesses such that when the planar rear wall 20 of the chassis 14 is placed in contact with the wall surface the dip creates a void 4 behind the chassis 14, as illustrated in FIG. 12. To permit proper mounting of the LED panel 10 to an undulating surface, the LED panel 10 may include at least one adjuster assembly 30 connected to the rear wall 20 of the chassis 14. In general, the adjuster assembly 30 acts as a spacer between the rear wall 20 of the chassis 14 and the surface of the wall 2 or other structure to which the LED panel 10 is being mounted to span any voids 4.

Figure 13:
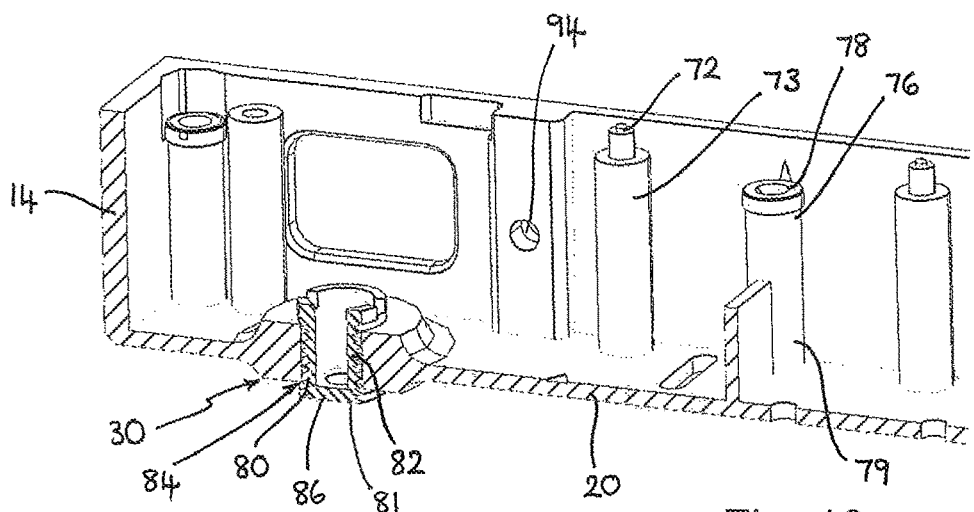
FIG. 13 is a perspective sectional view of a part of the chassis of one of the LED panels along the line XIII-XIII of FIG. 12.
Figure 14:
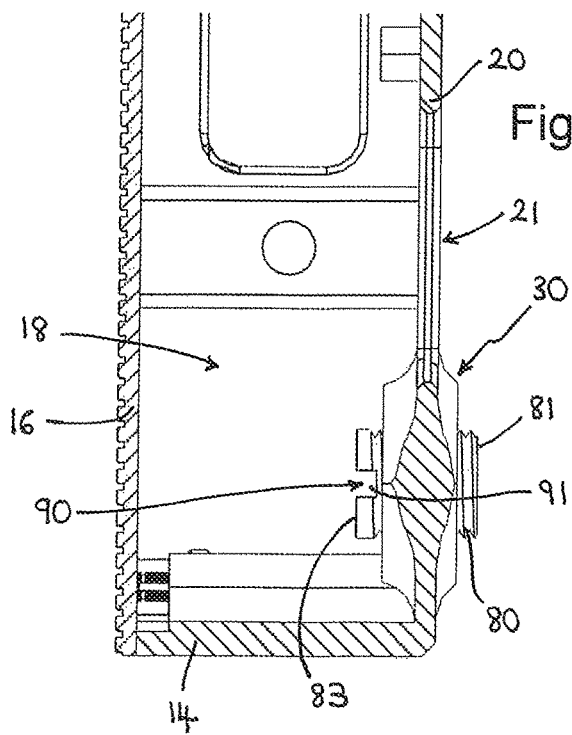
FIG. 14 is a cross-sectional view of a part of the chassis of one of the LED panels along the line XIV-XIV of FIG. 12.
Figure 15:
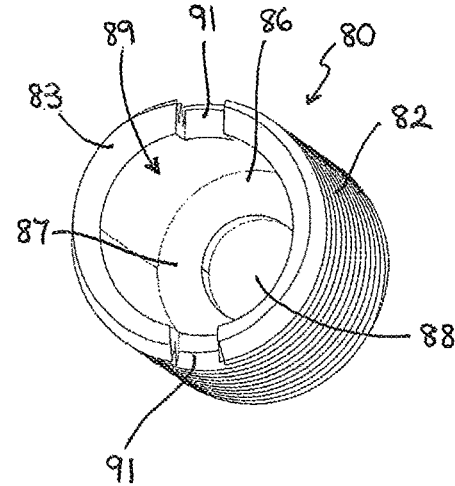
FIG. 15 is a perspective view of one example of an adjustment member in accordance with the present disclosure.

As shown most clearly in FIGS. 13 to 15 the adjuster assembly 30 includes a foot member 80 that is moveably connected to the rear wall 20 of the chassis 14. In this embodiment the foot member 80 includes an externally threaded cylindrical tube 82. The tube 82 is elongate and extends between first and second ends 81, 83. The first end 81 of the tube 82 provides an abutment surface 81 of the foot member 80. The tube 82 engages with a threaded hole 84 in the rear wall 20 of the chassis 14. In this way, rotation of the foot member 80 in a first direction causes a first end portion of the foot member 80 to protrude further from a rear surface 21 of the rear wall 20 of the chassis 14, i.e. a distance between the rear surface 21 of the chassis 14 and the abutment surface 81 of the foot member 80 increases. Rotation of the foot member 80 in a second, opposite direction retracts the foot member 80, i.e. a distance between the rear surface 21 of the chassis 14 and the abutment surface 81 of the foot member 80 decreases.

A mounting member 86 in the form of a plate 87 extends across the first end 81 of the tube 82. The plate 87 includes an aperture 88 for receiving a fastener such as a screw. The aperture 88 is preferably aligned centrally with a bore 89 of the tube 82. In this way the aperture 88 may be accessed from the second end 83 of the tube 82 through the bore 89 of the tube 82.

In embodiments, a second end portion of the foot member 80 extends into the interior space 18 of the chassis 14. The second end 83 of the cylindrical tube 82 includes a drive formation 90 in the form of a pair of notches 91. The notches 91 are disposed on diametrically opposite sides of the tube 82. The notches 91 are configured to receive a blade of a tool, such as a screw driver, that may be used to apply a rotational force to the foot member 80. Accordingly, rotation of the foot member 80 may be driven from a front side of the chassis 14 (before an LED tile 16 has been affixed to the chassis 14) by engaging a suitable tool with the second end 83 of the foot member 80. The drive formation 90 may be of any suitable form and may include, for example a recess shaped to receive a hex key (Allen key).

In embodiments, the LED panel 10 includes a plurality of adjuster assemblies 30. As shown most clearly in FIG. 5, the LED panel 10 includes four adjuster assemblies 30, one disposed proximate each corner of the rear wall 20 of the chassis 14. Of course, any suitable number of adjuster assemblies 30 may be used.

In addition to accommodating any undulations or dips in the wall 2 or other structure to which the LED panels 10 are mounted, the adjuster assemblies 30 also permit accurate alignment of one LED panel 10 with one or more neighbouring LED panels 10 of an LED display 12. To display a seamless image across the LED display 12, LED panels 10 may be mounted relative to one another to produce a flat overall screen. The relative position of each LED panel 10 with respect to adjacent panels can have an impact on the quality of the overall screen. For example, When LED panels 10 are placed too tightly (closely) together, joins between adjacent panels may be observed as bright lines in the image on the overall screen LED screen. Conversely, when LED panels 10 are placed too loosely (i.e., too far) from one another, dark lines may be visible in the image produced by the overall screen. To address those issues, in embodiments LED panels 10 are mounted such that the LED tiles 16 mounted to the chassis 14 of the LED panels 10 lie in the same plane and are positioned at a suitable distance from each other. For example, the chassis 14 of several LED panels 10 may be mounted on a wall 2 such that the top edges of the side walls 32, 34 of each of the chassis 14 lie in the same plane. This may be accomplished by adjusting the position of each of the foot members 80 relative to the rear wall 20 of the respective chassis 14, so as to move the rear wall 20 of the chassis 14 further away from or closer to the supporting wall 2 and bring fronts 36 of the chassis 14 into alignment.

During installation of an LED display 12 on a supporting wall 2, a first chassis 14 is placed against the surface of the wall 2 (method step 300). The foot member 80 of each of the adjuster assemblies 30 of this first LED panel 10 is then rotated so that the abutment surface 81 of the foot member 80 contacts the wall surface (method step 302). A fastener, such as a screw, is then inserted through the aperture 88 in the mounting member 86 and secured into the wall 2 (method step 304). At this stage the fastener is not fully tightened so that some rotation of the foot member 80 is still possible. A chassis 14 of a second LED panel 10 is then positioned next to the first chassis 14 (method step 306). The foot member 80 of each of the adjuster assemblies 30 of this second LED panel 10 is rotated so that the abutment surface 81 of the foot member 80 contacts the wall surface (method step 308). A fastener is inserted through the aperture 88 in the mounting member 86 and secured into the wall 2 (method step 310). Again, at this stage the fastener is not fully tightened so that some rotation of the foot member 80 is still possible. Alignment of the top edges of the side walls 32, 34 of the first and second chassis 14 is then checked to establish if the front 36 of the first chassis 14 lies in the same plane as the front 36 of the second chassis 14 (method step 312). If not, then one or more of the foot members 80 of one or both of the first and second LED panels 10 is rotated as necessary to bring the top edges of the side walls 32, 34 into alignment (method step 314). When the front 36 of the first chassis 14 lies in the same plane as the front 36 of the second chassis 14 the fasteners are fully tightened to prevent further rotation of the foot members 80 (method step 316).

As discussed above it may be desirable to align and position neighbouring chassis 14 relatively close to one another to create a seamless display screen. However, neighbouring chassis 14 should not be positioned too closely to each other, as doing so may cause damage to the edge 56, 58 of an LED tile 16 by lateral pressure applied by a neighbouring LED tile 16.

In some embodiments each side wall 32, 34 of the chassis 14 includes a mating hole 92, 94 for receiving a shoulder bolt 96 for connecting adjacent chassis 14. As shown in FIG. 2, each side wall 32, 34 of the chassis 14 may include two mating holes 92, 94 spaced apart along the length of the side wall 32, 34. Of course, any suitable number of mating holes may be used.

When the chassis 14 are positioned in an array as described above, a first long side wall 32 of one LED panel 10 will be adjacent to and optionally in contact with a second long side wall 32 of another LED panel 10. Similarly, a first short side wall 34 of one LED panel 10 will be adjacent to and optionally in contact with a second short side wall 34 of another LED panel 10. A first mating hole 92 in the first long side wall 32 is therefore arranged to align with a second mating hole 94 in the second long side wall 32, and a first mating hole 92 in the first short side wall 34 is therefore arranged to align with a second mating hole 94 in the second short side wall 34.

Figure 16:
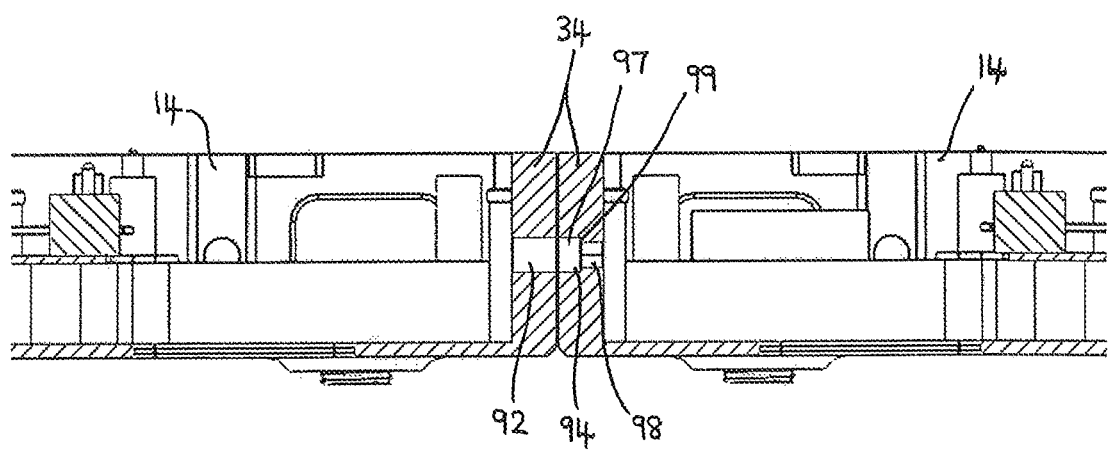
FIG. 16 illustrates two chassis in a side by side arrangement, showing in particular aligned mating holes of the chassis.
Figure 17:
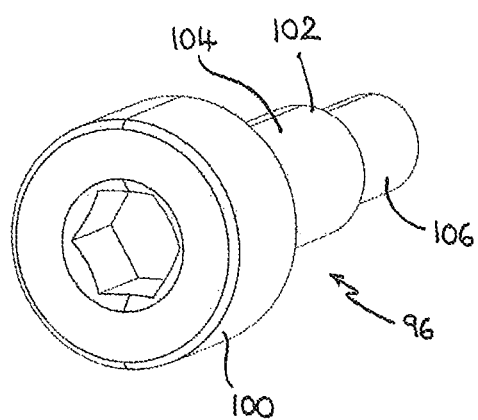
FIG. 17 is a perspective view from a first end of a shoulder bolt for insertion through the aligned mating holes in the chassis of FIG. 16.
Figure 18:
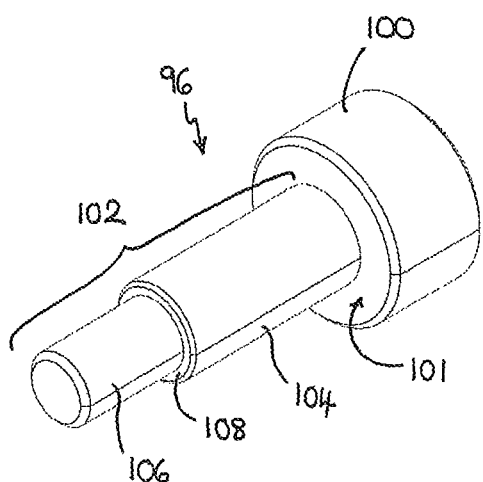
FIG. 18 is a perspective view from a second end of the shoulder bolt of FIG. 17.

Referring now to FIGS. 16 to 18, the aligned first and second mating holes 92, 94 are configured to receive shoulder bolts 96. The first mating holes 92 extend through the full thickness of the respective chassis side wall 32, 34 and have a constant diameter. The second mating holes 94 also extend through the full thickness of the respective chassis side wall 32, 34. The second mating holes 94 have a first section 97 having a first diameter, which is the same as the diameter of the first mating holes 92, and a second section 98 having a second, smaller diameter, such that an annular seat 99 is defined between the first and second sections 97, 98. The second section 98 of the second mating holes 94 is threaded. The first section 97 of the second mating holes 94 is adjacent an outer surface of the side wall 32, 34 and the second section 98 of the second mating holes 94 is adjacent an inner surface of the side wall 32, 34. In this way, and as shown in FIG. 16, when first and second mating holes 92, 94 are aligned, the first section 97 of the second mating hole 94 is contiguous with the first mating hole 92.

Each shoulder bolt 96 includes a head 100 and a shaft 102. The shaft 102 includes a first, proximal section 104 having a first diameter and a second, distal section 106 having a second diameter, wherein the second diameter is smaller than the first diameter. The proximal section 104 of the shaft 102 extends from an underside surface 101 of the head 100, and the distal section 106 of the shaft 102 extends from the proximal section 104 such that a shoulder 108 is defined between the proximal section 104 and the distal section 106.

The diameter of the proximal and distal sections 104, 106 of the shaft 102 corresponds to the diameters of the first and second sections 97, 98 of the second mating hole 94 respectively such that, in use, the shaft 102 of the shoulder bolt 96 is received in aligned first and second mating holes 92, 94. Furthermore, the distal section 106 of the shaft 102 is threaded for engagement with the threaded second section 98 of the second mating holes 94.

During installation of the LED panels 10 to form a display screen 12, once two panels 10 have been aligned and adjusted for flatness as described above, a shoulder bolt 96 is inserted into and engaged with aligned mating holes 92, 94 of neighbouring chassis 14 to secure two neighbouring chassis 14 together. The threaded distal section 106 is engaged with the threaded second section 98 of the second mating hole 94. The length of the proximal section 104 of the shaft 102 of the bolt 96 is such that the bolt 96 can be tightened until the underside surface 101 of the head 100 of the bolt 96 is in contact with the inner surface of the chassis side wall 32, 34 surrounding the first mating hole 92 and the shoulder 108 of the bolt 96 contacts the annular seat 99 of the second mating hole 94.

Once the plurality of chassis 14 have been installed in an array and power and data connections have been made between the chassis 14, the LED tiles 16 can be connected to the fronts 36 of the chassis 14. As described above, each LED tile 16 includes power and data connectors 62, 64, which connect to corresponding power and data connectors 68, 66 in the chassis 14 when the LED tile 16 is affixed to the chassis 14.

Figure 5:
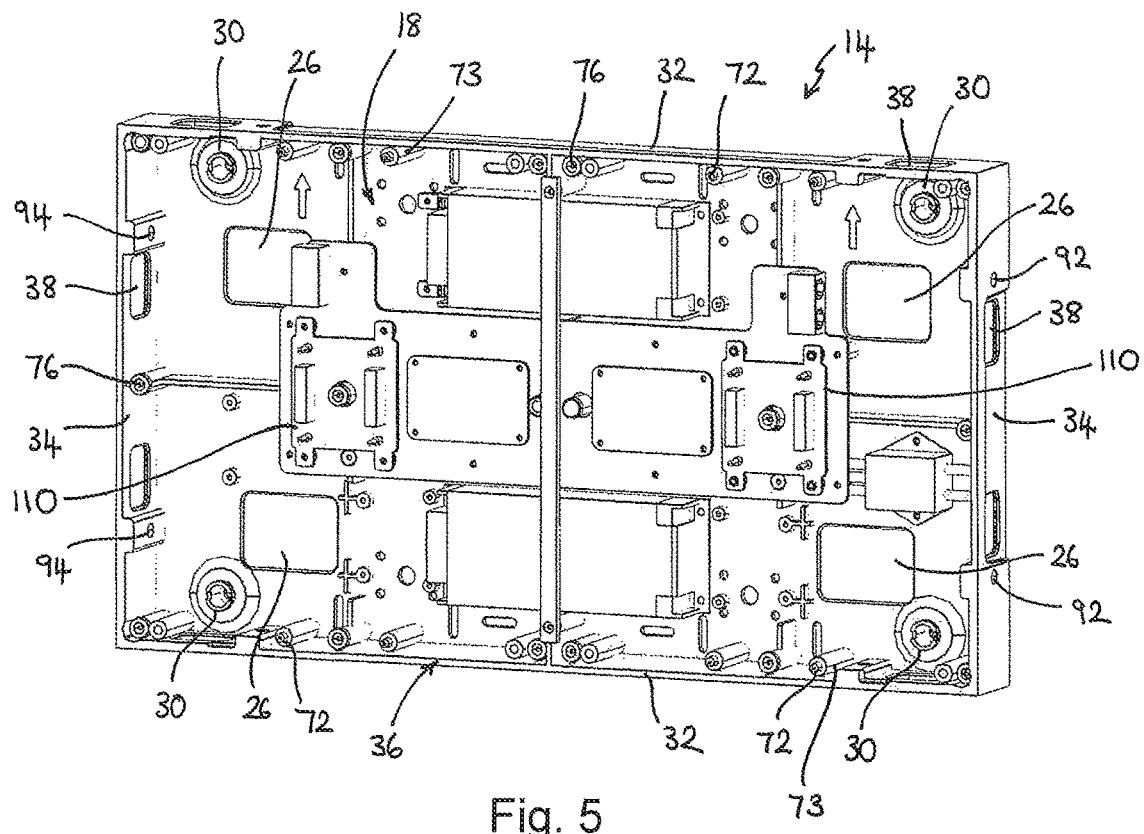
FIG. 5 is a perspective view of the chassis and internal components of the LED panel of FIG. 1.

To enable secure and reliable power and data connections, each LED panel 10 may include a floating connector assembly 110 mounted in the chassis 14. Each floating connector assembly 110 is configured to form power and data connections to a single LED tile 16. Accordingly, in embodiments in which two LED tiles 16 are mounted to a single chassis 14, two separate floating connector assemblies 110 are provided in the chassis 14, as illustrated in FIG. 5.

One example of a floating connector assembly 110 consistent with the present disclosure is shown most clearly in FIGS. 19 to 22. Each floating connector assembly 110 comprises a carriage member 112 in the form of a support board 112. At least one power connector 68 and at least one data connector 66 project from a first surface of the support board 112, such as front surface 114. Suitable power cables and data cables (not shown) may be connected to the respective connectors 68, 66 through the support board 112 from a second surface of the support board 112, such as rear surface 116.

The data connectors 66 and power connectors 68 of the connector assembly 110 are configured to engage with and form a connection with the corresponding data connectors 64 and power connectors 32 of the LED tile 16. Accordingly, in some embodiments the connector assembly 110 comprises a first data connector 66a and a second data connector 66b, and a first pair of power connectors 68a and a second pair of power connectors 68b. The first data connector 66a is disposed between the power connectors 68a of the first pair to form a first set of connectors and the second data connector 66b is disposed between the power connectors 68b of the second pair to form a second set of connectors. As shown most clearly in FIG. 22, the power and data connectors 68, 66 extend from the support board 112 in a direction towards the front 36 of the chassis 14.

One or more biasing members 118 is/are disposed between the carriage member 112 and the chassis 14 and is/are arranged to urge the carriage member 112 in a direction towards the front 36 of the chassis 14. In embodiments a plurality of biasing members 118 are provided. Each biasing member 118 may be linked to or act on a different region of the carriage member 112. This permits a plane of the carriage member 112 to tilt with respect to a plane of the rear wall 20 of the chassis 1. I.e., the biasing members 118 allow the support board 112 to lie in a plane that is not parallel to the plane of the rear wall 20 of the chassis 14. In the illustrated embodiment the floating connector assembly 110 includes four biasing members 118 in the form of springs 118, wherein each spring 118 is disposed proximate a corner of the support board 112. Of course, any suitable number and type of biasing members may be used.

The floating connector assembly 110 further includes a retaining member 120 that limits movement of the carriage member 112 in a direction towards the front 36 of the chassis 14. The retaining member 120 may also limit lateral movement of the carriage member 112 such that the carriage member 112 primarily moves in a direction perpendicular to the rear wall 20 of the chassis 14.

In embodiments the retaining member 120 is in the form of a retaining pin 120 comprising a shaft 122 and a head 124. The retaining pin 120 extends through a hole 126 in the support board 112 such that the head 124 of the pin 120 is disposed on a front side of the support board 112. A distal end region of the shaft 122 is connected and fixed to a part of the chassis 14. Forward movement of the support board 112 is limited by contact between the front surface 114 of the support board 112 and a surface of the head 124 of the pin 120.

Figure 19:
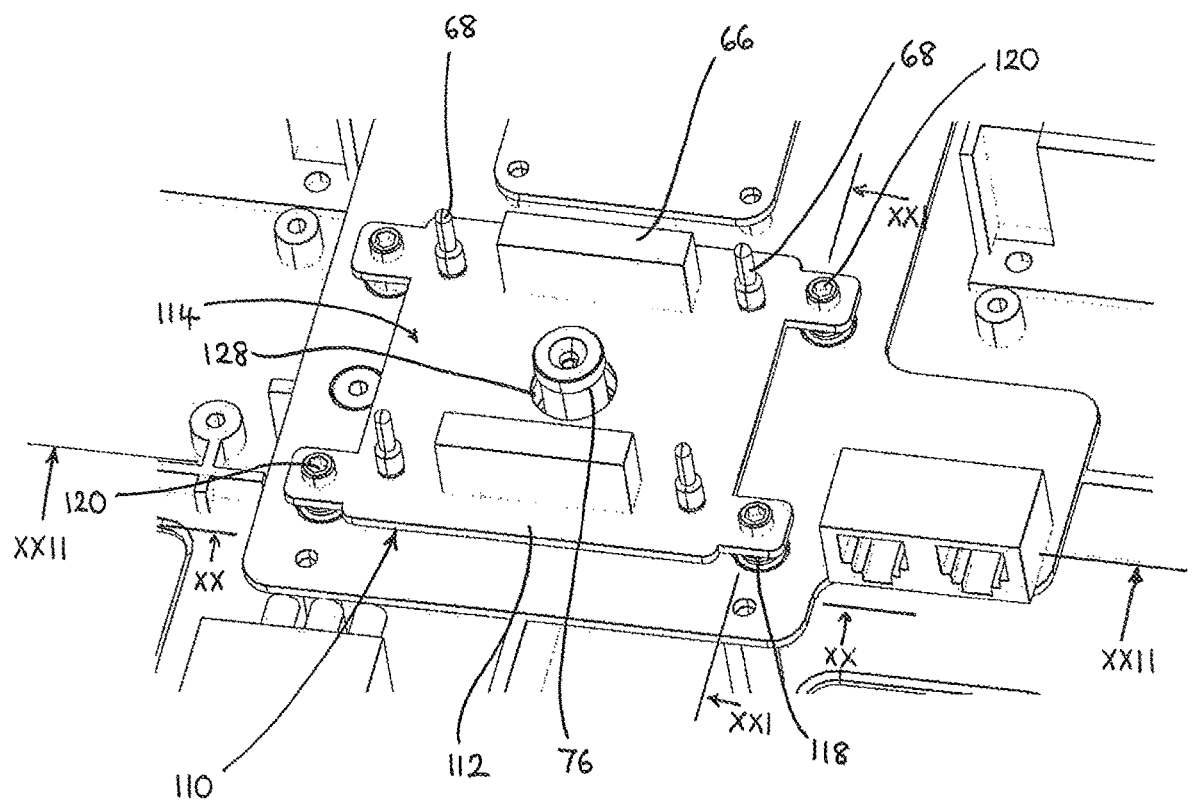
FIG. 19 is a perspective view of one example of a floating connector assembly mounted in the chassis of FIG. 1 and arranged to form power and data connections to one of the LED tiles.
Figure 20:
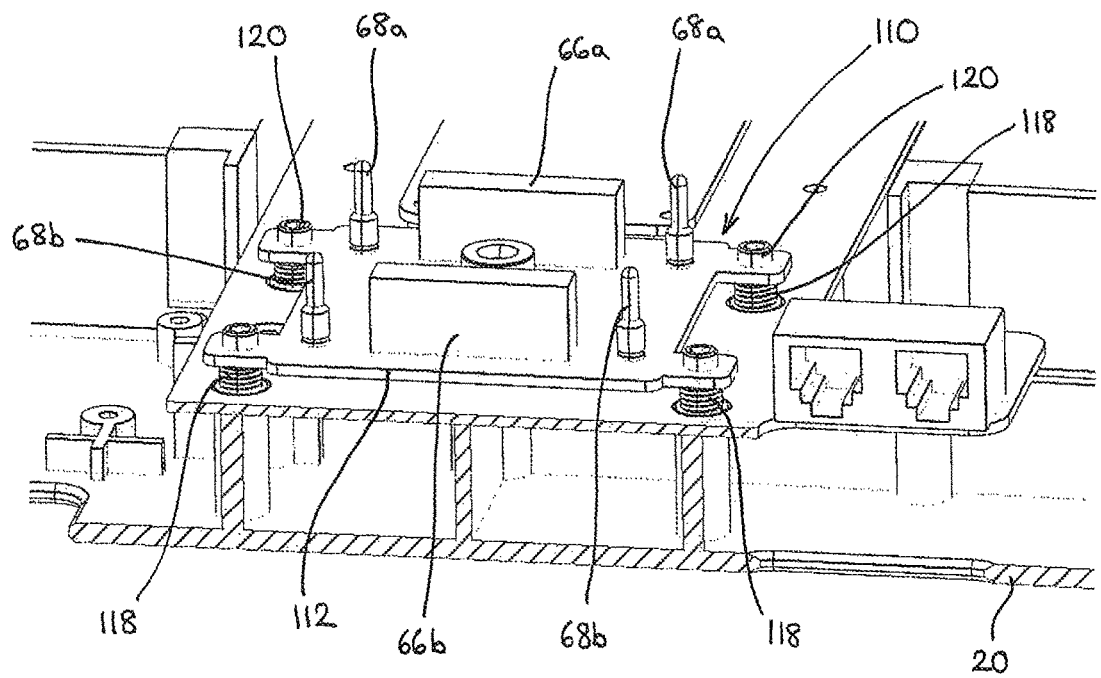
FIG. 20 is a perspective sectional view along the line XX-XX of a part of the chassis showing the floating connector assembly of FIG. 19.

As shown most clearly in FIGS. 19 and 20, the floating connector assembly 110 includes four retaining pins 120, wherein each retaining pin 120 is disposed proximate a corner of the support board 112. Each of the springs 118 surrounds a portion of the shaft 122 of a respective pin 120. Moreover, each spring 118 extends between the rear surface 116 of the support board 112 and a part of the chassis 14 to which the distal end of the pin 120 is connected, as shown most clearly in FIG. 21.

In embodiments a securing element 76 is located proximate the floating connector assembly 110. As shown most clearly in FIG. 21, the carriage member 112 may include an aperture 128 through which a part of the securing element 76 extends. In such instances a corresponding securing member 74 of the LED tile 16 is able to engage with this securing element 76 when the LED tile 16 is mounted on the chassis 14—securely holding the LED tile 16 proximate the data and power connections.

Figure 21:
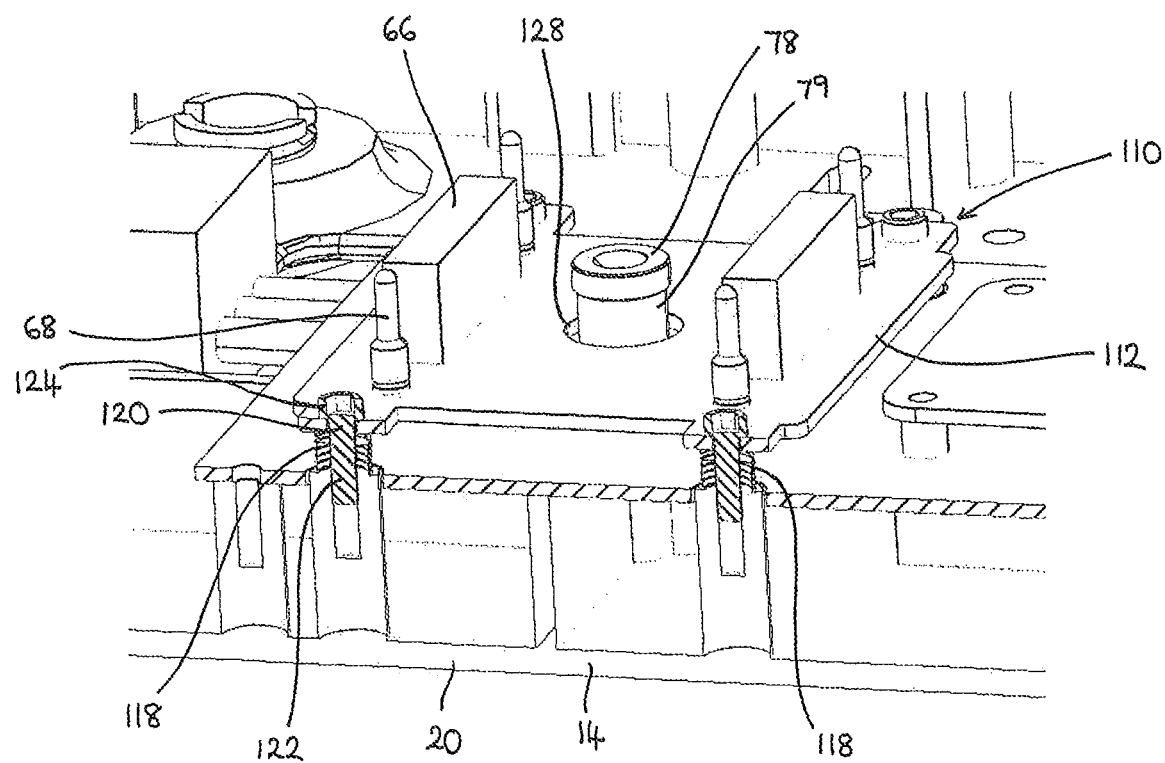
FIG. 21 is a perspective sectional view along the line XXI-XXI of the floating connector assembly of FIG. 19.
Figure 22:
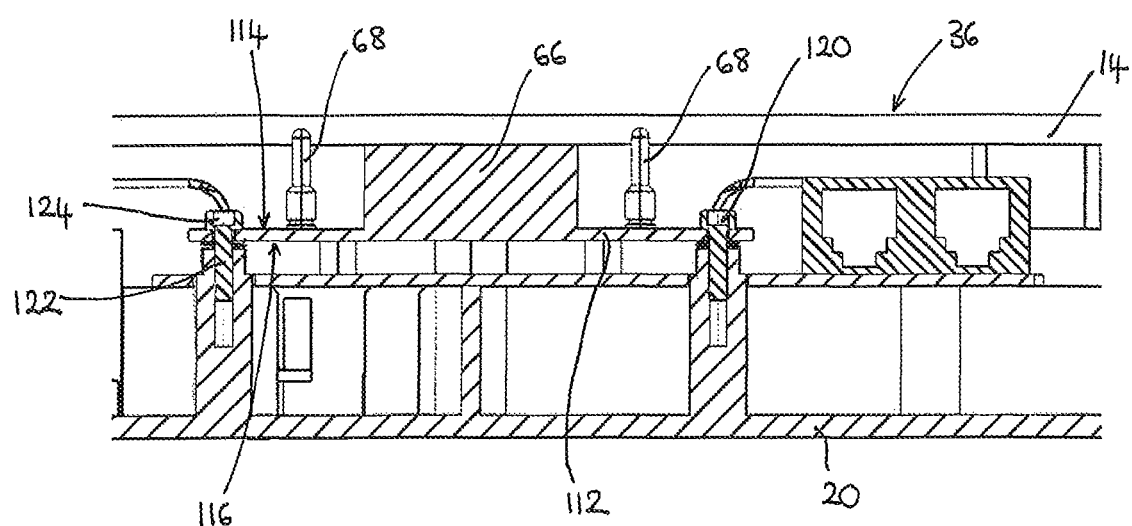
FIG. 22 is a cross-sectional view along the line XXII-XXII of the connector assembly of FIG. 19.
Figure 27:
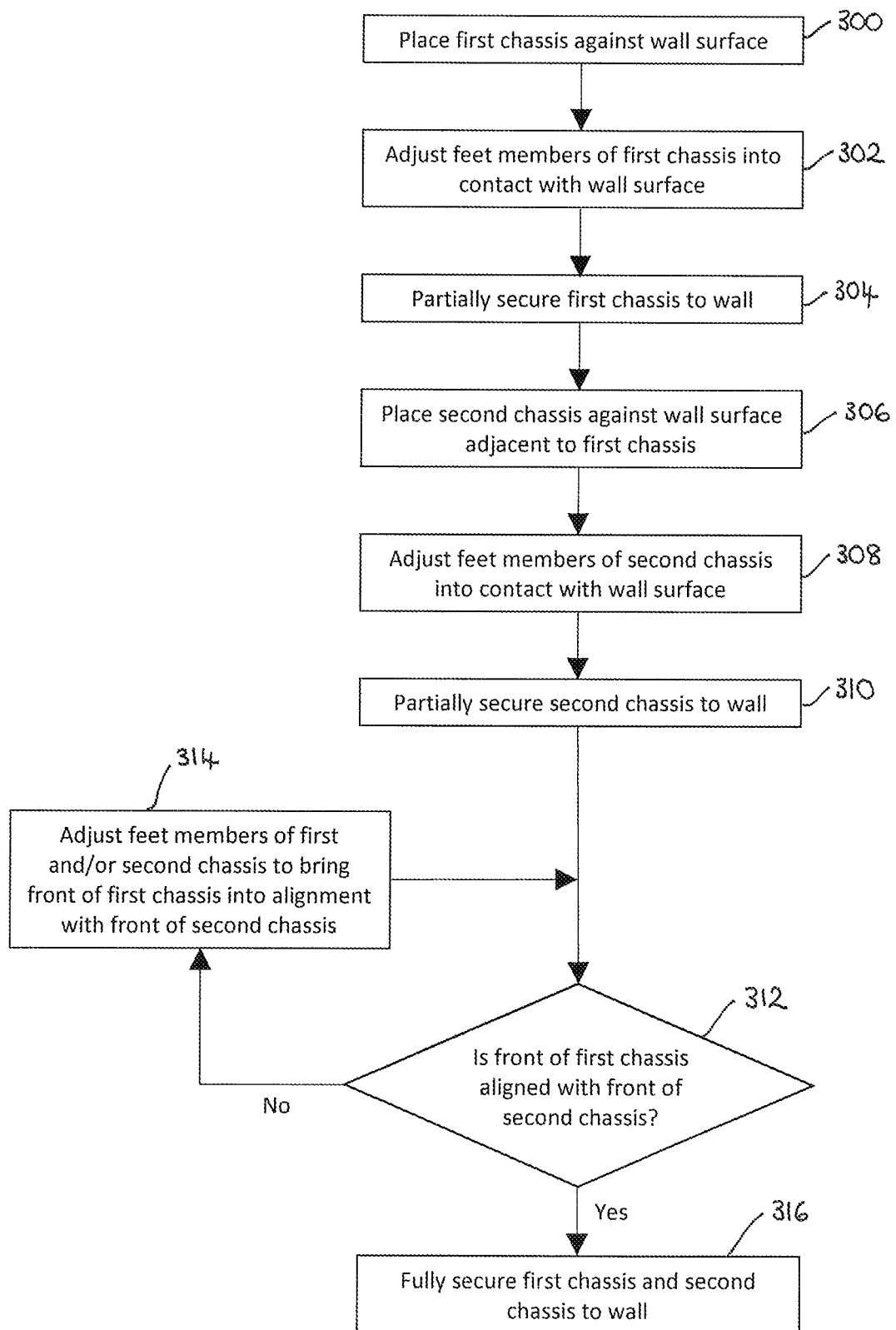
FIG. 27 is a flow chart of example operations in accordance with one embodiment of a method of installing an LED display on a wall, in accordance with the present disclosure.

In embodiments a post 79 of a securing element 76 extends through an aperture 128 located centrally in the support board 112, as best shown in FIG. 21. A metal seat 78 of the securing element 76 is disposed between the first and second sets of connectors 66, 68 of the floating connector assembly 110.

Referring now to FIGS. 23 to 25, when an LED tile 16 is secured to the front 36 of the chassis 14 the securing members 74 (e.g., magnetic feet) of the LED tile 16 engage with the securing elements 76 (metal seats 78) of the chassis 14. Additionally, the alignment pins 72 locate in the alignment recesses 70. This facilitates proper positioning of the LED tile 16 on the chassis 14, as well as the connection of power and data connectors 62, 64 with the power and data connectors 68, 66. More specifically, the floating connector assembly 110 biases the power and data connectors 68, 66 in the chassis 14 towards the LED tile 16 and into engagement with the power and data connectors 62, 64 of the LED tile 16—enabling a reliable and robust connection.

In some embodiments the data connectors 62, 64 are low insertion force data connectors. This is in contradistinction to traditional data connectors, such as a multi-pin connector requiring a relatively high amount of force to establish the required connection.

In embodiments the LED tile 16 includes first parts of both first and second sets of power and data connectors 62, 64, and corresponding second parts of both the first and second sets of power and data connectors 68, 66 are housed in the chassis 14. The first and second sets of data connectors 62, 64, 68, 66 may be configured to operate in parallel. Thus, if there is a failure of one or other of the first and second sets of data connectors 62, 64, 68, 66, power and data connections may still be provided by the other one of the first and second sets of data connectors 62, 64, 68, 66, such that there is no interruption of power or data to the LED tile 16.

It will be appreciated that, while the above description considered mounting of the LED panels 10 directly on the surface of a wall 2, in other embodiments the LED panels 10 may be mounted to a frame or other supporting structure, which may have been purpose built for the LED display 12.

Furthermore, in the preceding description the LED panel 10 included two LED tiles 16. In other embodiments the LED panel may include only one LED tile or may include more than two LED tiles. For example, the LED panel may include three LED tiles, four LED tiles, five LED tiles, or more.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents.

What is claimed is:

1. An LED panel for a modular display screen comprising:
a chassis including a plurality of chassis alignment features and a plurality of chassis securing elements;
an LED tile comprising a plurality of surface mount devices attached to a first surface of the LED tile, a plurality of the alignment features on a second surface of the LED tile opposite to the first surface, and a plurality of the securing elements on the second surface of the LED tile, wherein each of the plurality of the securing elements is engaged with a respective one of the plurality of chassis securing elements, the LED tile further comprises a first power connector and a first data connector projecting from the second surface of the LED tile, and the LED tile is removeably mounted to a front of the chassis;
a connector assembly mounted within an interior space of the chassis, the connector assembly comprising:
a support board moveable relative to the chassis;
a second power connector and a second data connector projecting from a first surface of the support board in a direction toward the front of the chassis; and
a biasing member arranged to urge the support board in a direction towards the front of the chassis, such that the second power connector and second data connector engage with the first power connector and first data connector, respectively; wherein:
the chassis alignment features and the tile alignment features comprise alignment recesses and alignment pins receivable in the alignment recesses, the chassis securing elements and the tile securing elements comprise magnetic feet and metal seats;
the support board comprises an aperture; and
at least one of the magnetic feet or one of the metal seats extends through the aperture.

2. The LED panel of claim 1, wherein the biasing member is disposed between the support board and a part of the chassis.

3. The LED panel of claim 1, wherein the connector assembly comprises a plurality of biasing members.

4. The LED panel of claim 3, wherein each of the biasing members is disposed proximate a corner of the support board.

5. The LED panel of claim 1, wherein the biasing member is a spring.

6. The LED panel of claim 1, wherein the connector assembly further comprises a retaining member arranged to limit movement of the support board in a direction towards the front of the chassis.

7. The LED panel of claim 1, wherein the first and second data connectors are low insertion force data connectors.

8. The LED panel of claim 1, wherein the LED tile further comprises a third power connector and a third data connector, the connector assembly comprises a fourth power connector and a fourth data connector, and, in use, the fourth power connector and fourth data connector engage with the third power connector and third data connector, respectively.

9. The LED panel of claim 1, wherein the LED panel comprises two LED tiles and two connector assemblies mounted on the chassis, each of the LED tiles including a first power connector and a first data connector and each of the connector assemblies including a second power connector and a second data connector, and wherein, in use, a first one of the LED tiles engages with a first one of the connector assemblies and a second one of the LED tiles engages with a second one of the connector assemblies.

10. The LED panel of claim 9, wherein each of the LED tiles further comprises a third power connector and a third data connector, each of the connector assemblies further comprises a fourth power connector and a fourth data connector, and, in use, the fourth power connector and fourth data connector of each of the connector assemblies engage with the respective third power connector and third data connector of a respective one of the LED tiles.

11. The LED panel of claim 1, wherein at least a portion of the alignment recesses are recesses in the second surface of the LED tile, and at least a portion of the alignment pins protrude from the front of the chassis.

12. A method of installing an LED display, comprising:

mounting a plurality of chassis to a surface, each chassis comprising a plurality of chassis alignment features and a plurality of chassis securing elements;

aligning neighbouring chassis and securing the neighbouring chassis together; and subsequently removeably mounting a plurality of LED tiles to a front of the plurality of chassis such that each of the plurality of chassis alignment features of each one of the plurality of chassis engage with a corresponding tile alignment feature of a respective one of the plurality of LED tiles, and each of the plurality of chassis securing elements engage with a corresponding tile securing element of the LED tile, each LED tile comprising a plurality of surface mount devices attached to a first surface of the LED tile, wherein each LED tile further comprises a first power connector and a first data connector projecting from a second surface of the LED tile; and a connector assembly mounted within an interior space of each one of the plurality of chassis, the connector assembly comprising:
   a support board moveable relative to its corresponding chassis;
   a second power connector and a second data connector projecting from a first surface of the support board in a direction towards the front of its corresponding chassis; and
   a biasing member arranged to urge the support board in a direction towards the front of its corresponding chassis, such that the second power connector and second data connector engage with the first power connector and first data connector, respectively;
wherein:
   the chassis alignment features and the alignment features comprise alignment recesses and alignment pins receivable in the alignment recesses;
   and the chassis securing elements and the tile securing elements comprise magnetic feet and metal seats;
   the support board comprises an aperture; and
at least one of the magnetic feet or one of the metal seats extends through the aperture.

13. The LED panel of claim 1, wherein each alignment pin extends from an alignment post and the alignment pin is adhesively secured to the alignment post.

14. The LED panel of claim 1, wherein the chassis comprises a rear wall and side walls defining the interior space of the chassis.

15. The LED panel of claim 14, wherein the rear wall of the chassis comprises mounting apertures for securing the chassis to a surface.

* * * * *